(12) United States Patent
Wynn

(10) Patent No.: US 6,941,630 B2
(45) Date of Patent: Sep. 13, 2005

(54) ADAPTER FOR AN AIR CLEANER CABINET

(75) Inventor: Gerald M. Wynn, Sanford, NC (US)

(73) Assignee: Carrier Corporation, Farmington, CT (US)

( * ) Notice: Subject to any disclaimer, the term of this patent is extended or adjusted under 35 U.S.C. 154(b) by 200 days.

(21) Appl. No.: 10/647,565

(22) Filed: Aug. 25, 2003

(65) Prior Publication Data

US 2005/0044688 A1 Mar. 3, 2005

(51) Int. Cl.[7] ............................................. B01D 35/00
(52) U.S. Cl. ..................... 29/401.1; 312/352; 210/455; 248/205.1; 55/501
(58) Field of Search .......................... 29/401.1, 896.62; 312/210, 352; 210/348, 455; 248/205.1, 207, 213.2; 55/497, 501

(56) References Cited

U.S. PATENT DOCUMENTS 5,230,799 A * 7/1993 Willard et al. .............. 210/455

* cited by examiner

Primary Examiner—Jermie E. Cozart
(74) Attorney, Agent, or Firm—Wall Marjama & Bilinski LLP

(57) ABSTRACT

An air filter cabinet designed for a relatively large electronic air filter cells is adapted to receive and position a relatively smaller filter element without an associated loose fitting relationship and air leakage. A plurality of S-shaped adaptor elements are each removably interconnected to a respective guide rail in the cabinet to reduce the size of a cavity so as to accommodate the smaller filter element and secure it in a fixed position while preventing air leakage therearound.

7 Claims, 4 Drawing Sheets

ADAPTER FOR AN AIR CLEANER CABINET

BACKGROUND OF THE INVENTION

This invention relates generally to our air filters and, more particularly, to a housing for containing our air filters.

Within residential heating and cooling systems of the forced air type, it has become common to filter the air that passes through the system. The most common types of filters are simple mechanical filters for removing particulate from the air stream as it flows through a mesh. A chemical filtration capability can also be added by the insertion of certain materials such as carbon, to remove certain undesirable chemicals. Finally, an electric air cleaner structure may be provided wherein electrically charged elements are provided in the air flow stream to filter particulates from the air stream.

Typically, an air cleaner for residential use is installed in association with a furnace having a fan that circulates the heated or cooled air through the duct system. However, it may be placed at any location within the air flow system that is easily accessible for purposes of replacement or cleaning of the filter. That is, a filter is normally removably disposed within a housing, such that they can be periodically removed for cleaning or be replaced by a new filter element.

Inasmuch as the electronic filters are the most expensive types, it has become common for contractors to provide space for a standard sized housing according to the various types and brands of electronic air cleaners. Further, since it is desirable to remove the coarser particulates from the air stream with the use of a prefilter upstream of the electronic air cleaner, the housings are commonly designed with this additional space provided. Also, with the anticipation that a chemical filter may be desirably used in combination with the electronic air cleaner, a space is preferably provided on the downstream side of the housing in order to accommodate such a chemical filter.

The typical mechanical or cartridge filter is generally smaller in thickness and height than the insertable cells of an electronic air cleaner. Accordingly, if a homeowner wishes to simply use a mechanical air filter, in the standard electronic filter housing the mechanical filter will be prone to movement within the housing, and may result in leakage of airflow around the filter.

It is therefore an object of the present invention to provide an improved housing arrangement for a mechanical air filter element.

Another object of the present invention is the provision for using a standard electronic filter housing for a smaller mechanical filter element.

Yet another object of the present invention is the provision for a housing that will adequately support a mechanical air filter element with minium air leakage.

Still another object of the present invention is the provision for a mechanical air filter housing which is economical to manufacture and effective and efficient in use.

These objects and other features and advantages become more readily apparent upon reference to the following description when taken in conjunction with the appended drawings.

SUMMARY OF THE INVENTION

Briefly, in accordance with one aspect of the invention, a plurality of adaptor brackets are attached to respective guide rails of an electronic filter housing, such that a smaller thickness mechanical filter may be placed and securely held in the relatively larger housing.

By yet another aspect of the invention, the brackets are S-shaped with each one having an upstanding leg being attached to a vertically aligned guide rail which normally serves to slideably receive an electronic air filter element.

By yet another aspect of the invention, the S-shaped element is secured to the guide rail by a frictional engagement wherein a pair of parallel bracket legs straddle the guide rail to affix the bracket.

By still another aspect of the invention one of the parallel bracket legs has a pair of longitudinally extending ribs for engaging the rail.

By yet another aspect of the invention, one leg of the bracket is longer than the other so as to extend the vertical space thereof.

In the drawings as hereinafter described, a preferred embodiment is depicted; however, various other modifications and alternate constructions can be made thereto without departing from the true sprit and scope of the invention.

DESCRIPTION OF THE PREFERRED EMBODIMENT

Figure 1:
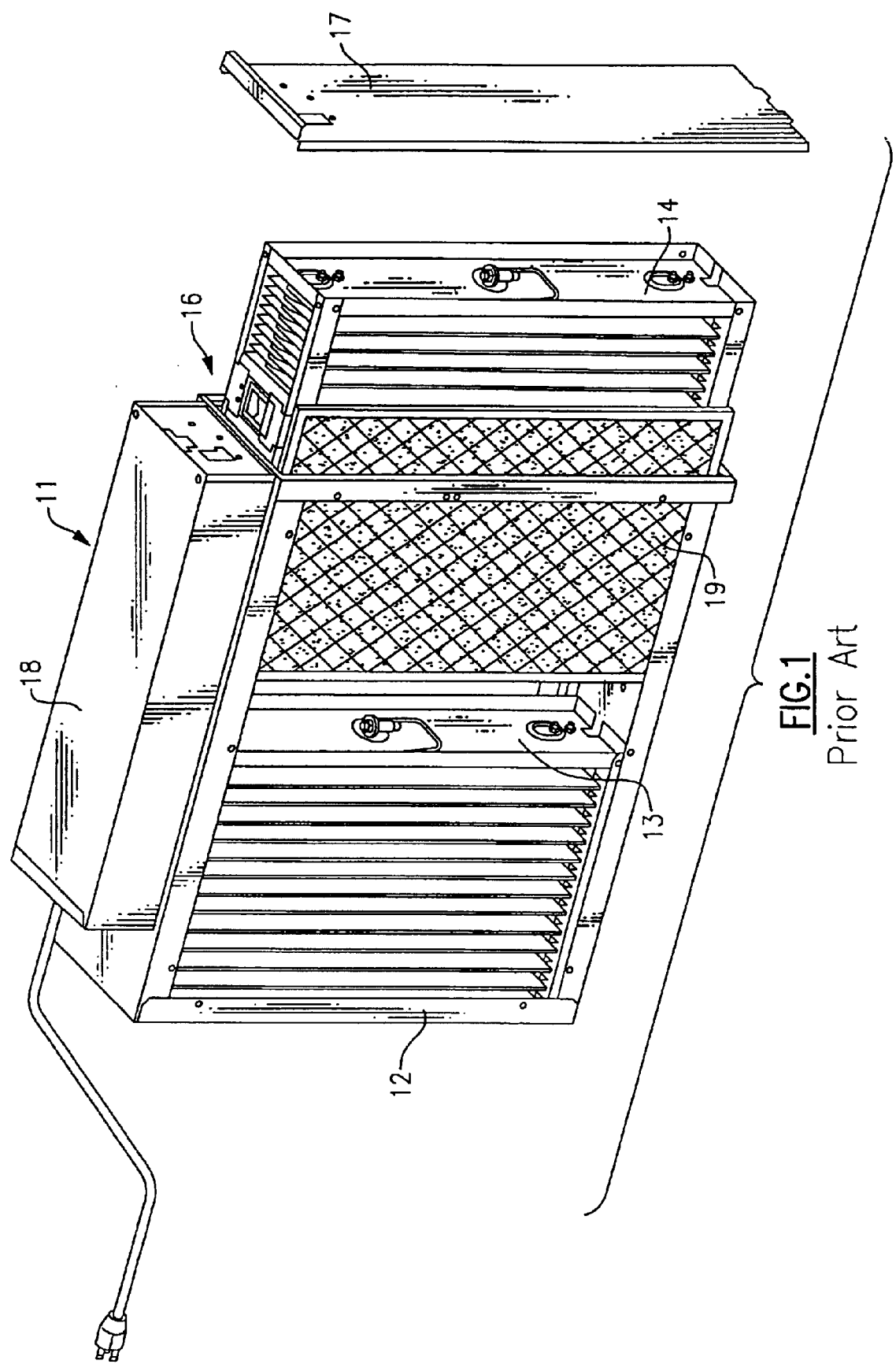
FIG. 1 is a perspective view of a conventional electronic air filter housing with the filter elements installed therein.

Referring now to FIG. 1 there is shown a typical electronic air filter assembly 11 of the type normally placed in the air flow stream flowing to a space to be heated and/or cooled. A duct mounted cabinet 12 is adapted to receive a pair of electronic cells 13 and 14 in end-to-end relationship as shown. The cells 13 and 14 are inserted into an open front end 16 which is then closed by an end cover 17. A power tray assembly 18 is mounted on top of the cabinet 12 and is adapted to provide electrical power to each of the cells 13 and 14 for purposes of providing high voltage electrical power to the individual ionizer wires therein.

The air to be cleaned is circulated through the air filter assembly 11 in the direction indicated by the arrows. A mechanical air filter 19 may be placed upstream of the cells 13 and 14 as shown in order to filter out the larger particles in the air stream. The mechanical air filter 19 is normally of the type which can be removed, cleaned and re-installed from time to time, but it may also be of the disposable type which is periodically replaced when dirty. The electronic cells 13 and 14 are adapted to be periodically removed, cleaned and re-installed.

Figure 2:
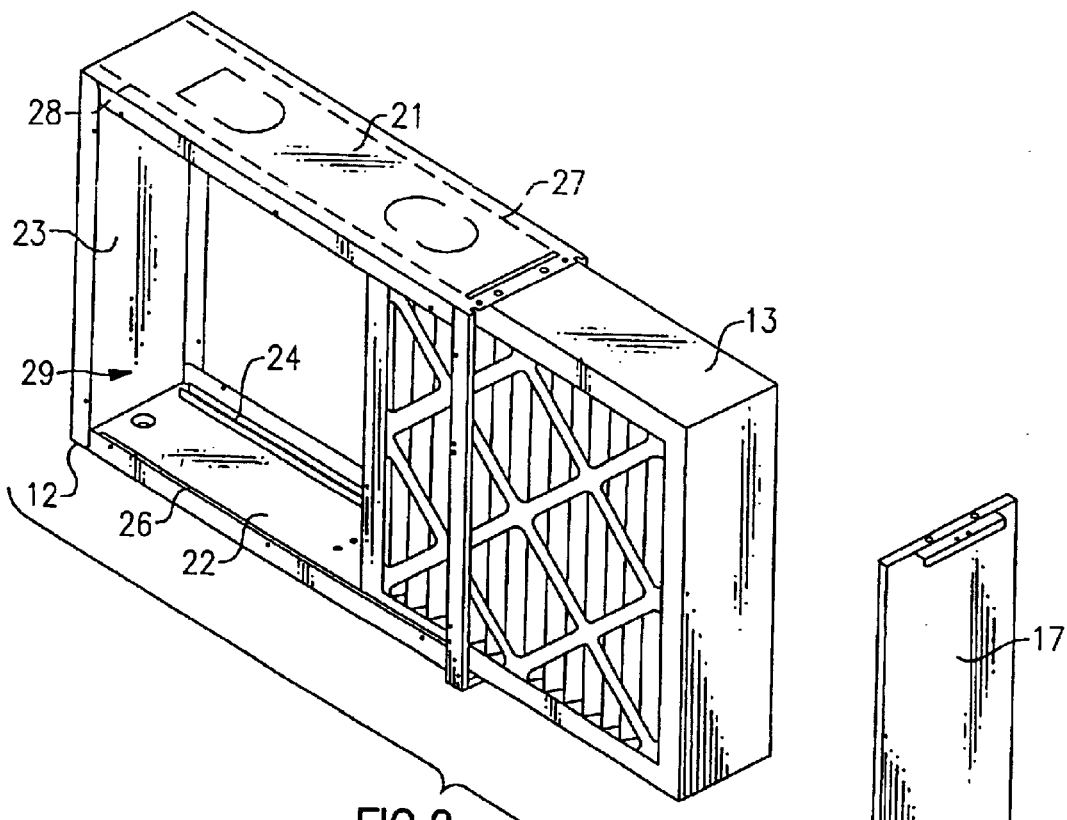
FIG. 2 is a perspective view of such a housing with an mechanical filter element disposed in a partially installed position.

Referring now to FIG. 2, the cabinet 12 is shown to include top and bottom side members 21 and 22 as well as a back side member 23. Attached to the bottom side member 22 is a pair of U-shaped guide rails 24 and 26 that are spaced apart in parallel relationship as shown. These guide rails are preferably permanently attached to the bottom side member 22 by welding or the like. Similarly, attached to the inner side of the top side member 21 are a pair of guide rails 27 and 28. The guide rails 24, 26, 27 and 28 collectively define the four corners of a cavity 29 for receiving the cells 13 and 14 therein. That is, the distance between the guide rails 24 and 26, and that between the guide rails 27 and 28 is slightly greater than the thickness or depth of the cells 13 and 14, such that the cells 13 and 14 fit snugly between the respective guide rail pairs.

The length of the guide rails do not extend the full length of the cabinet. The reason of this is that they are primarily for positioning and holding the cells 13 and 14 in place and therefore are not needed across the full length of the top and bottom sides 21 and 22. Further, at the front end, through which the cells are installed, it is preferable to leave some clearance between the end of the cabinet and the ends of the guide rails in order to accommodate certain portions of the door 17 that may project into the cabinet 12.

The space defined by the guide rails themselves (i.e., within the U-shaped members), are used to contain the mechanical or chemical filters. That is, the mechanical air filter 19 can be slid into the U-shaped openings of the guide rails 26 and 28. Similarly, a downstream filter can be slid into the U-shaped openings of the guide rails 24 and 27.

The electronic air filter assembly 11 as described hereinabove is of the standard size in the industry and is therefore desirable for use even when the cabinet 12 is used for containing disposable mechanical air filter cartridges. Such a disposable mechanical air filter cartridge is shown at 31 in FIG. 4. The filter element 31, which has a height h, width w and a depth d, is generally smaller in two dimensions then the pair of electronic filter cells 13 and 14. The filter cartridge is substantially twice as wide (i.e. in the w dimension) than the relatively heavy single cells 13 and 14 since, primarily for handling purposes, the cells 13 and 14 are preferably kept to a relatively narrow dimension. However, the thickness or depth d is less than that of the cells 13 and 14, and therefore less than the distance between the guide rails 24 and 26. Similarly, the height h is less than that of the cells 13 and 14. Accordingly, if the filter element 31 is installed directly into the cabinet 12, it would fit very loosely in the cavity 29 and would therefore not be precisely located therein so as to allow the movement of the filter within the cavity 29. Further, the flow of air would tend to pass around the edges of the filter 31 and therefore not be filtered.

Figure 3:
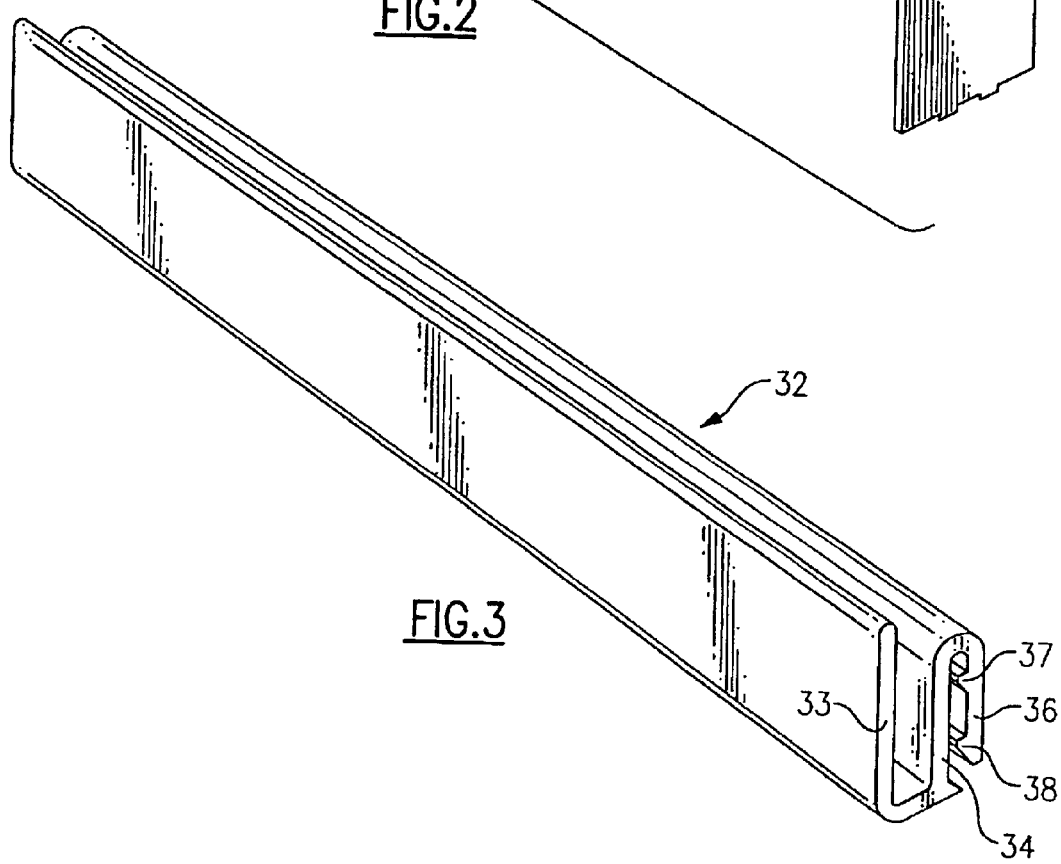
FIG. 3 is a perspective view of an adaptor in accordance with a preferred embodiment of the invention.

In order to solve this problem the present invention includes the use of a plurality of adaptors as shown at 32 in FIG. 3. The adaptor bracket 32 comprises a pair of integral, back-to-back U-shaped elements that are formed in a S-shape by the parallel legs 33, 34 and 36. The adaptor bracket 32 is sized and configured such that when one is installed on each of the four guide rails as described hereinabove, the size of the cavity 29 is reduced to substantially the size of the mechanical air filter 31.

The adaptor bracket 32 is preferably of a relatively stiff but somewhat flexible material such as plastic or the like. It is designed to be selectively installed and/or removed by simply clamping or unclamping from the installed position. This is facilitated by a pair of ribs 37 and 38 on the element 36 as shown in FIG. 3. The ribs 37 and 38 run the length of the element 36 and are indented to provide stiffness to the element 36 and also a gripping action when placed in the installed position as will be described hereinafter. The thickness of the element 32 is designed to coincide with the difference in thickness between the electronic cell units and the mechanical filter elements 31. That is, the distance between the outer side of element 33 and the outer side of element 34 is designed to reduce the size of the cavity 29 to substantially the thickness d of the filter element 31 as will be more fully described hereinafter.

The length of the adaptor element 32 is substantially equal to the width w of the air filter element 31. In this regard, it should be noted that this length is greater than that of the guide rails which, as mentioned above, do not extend the full width of the cabinet 12.

Figure 4:
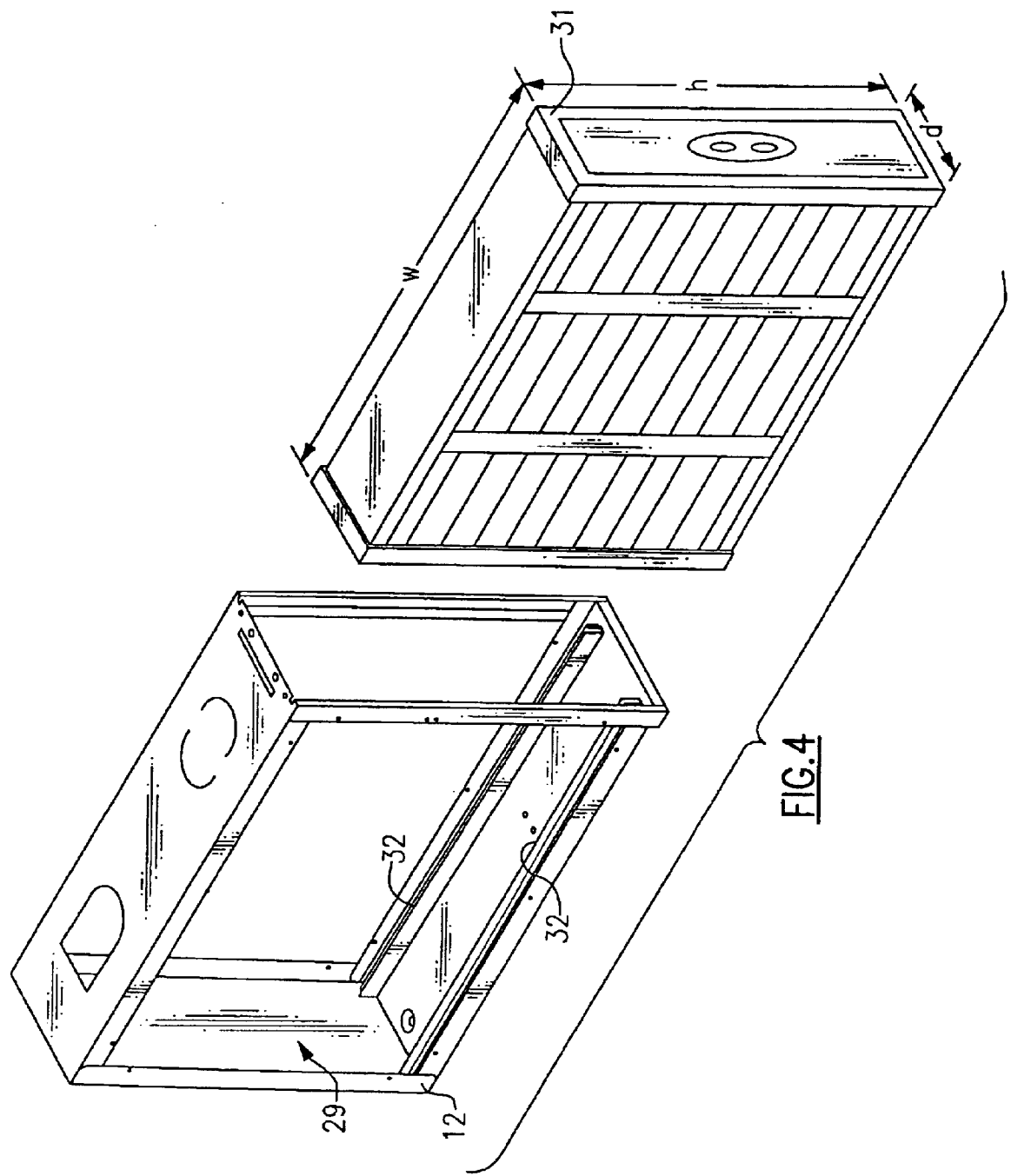
FIG. 4 is a perspective view of a housing with the adaptors of the present invention incorporated therein.
Figure 5:
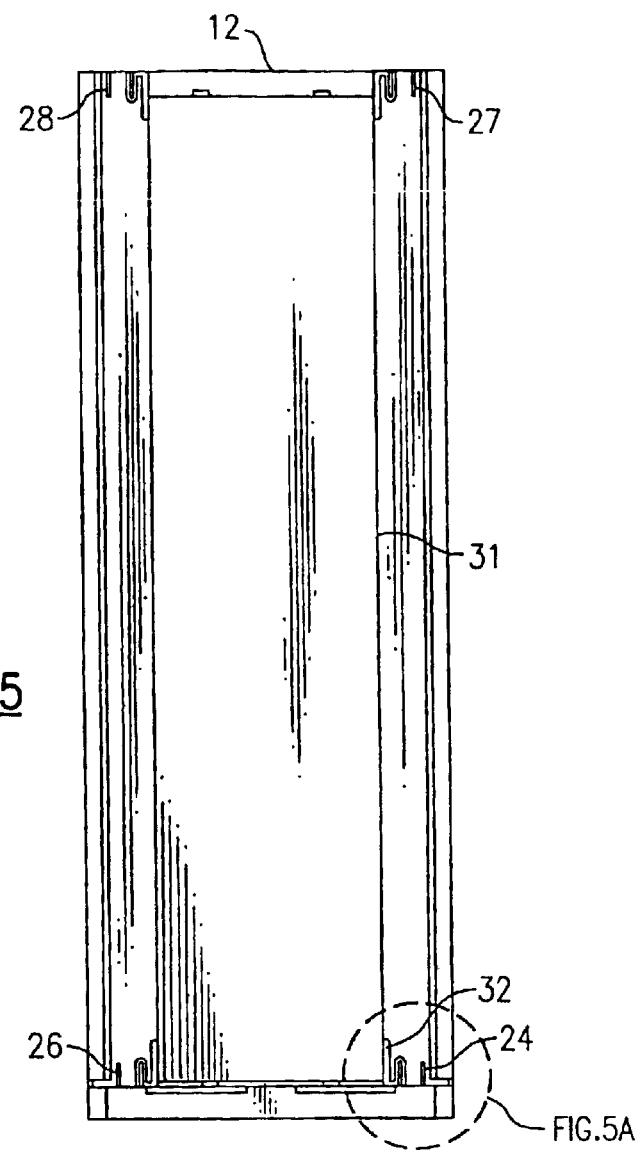
FIGS. 5 and 5A are end views of a mechanical filter as installed in a housing with adaptors incorporated therein.
Figure 5A:
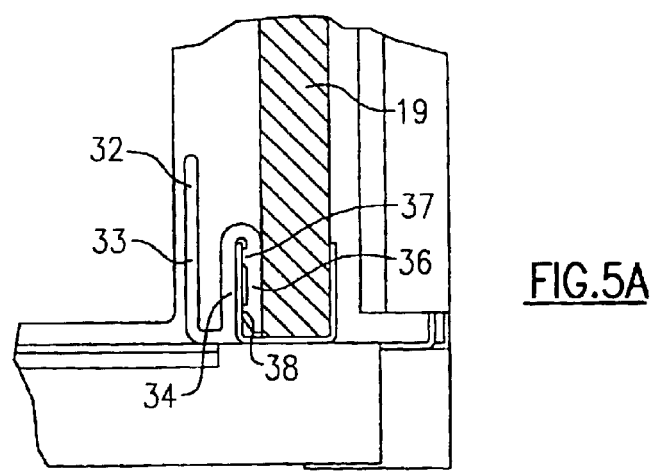

Referring now to FIGS. 4, 5 and 5A, the mechanical disposable filter 31 is shown in its respective about-to-be installed and its installed positions within the cabinet 12, with the adaptor brackets 32 being installed in the four corners of the cavity 29 to accommodate the difference in sizes as discussed hereinabove. The adaptor brackets 32 are installed by sliding the U-shaped portion formed by elements 34 and 36 over the inner leg of the U-shaped guide rail as shown in FIG. 5a. The ribs 37 and 38 act to frictionally engage the inner side of the U-shaped guide rail. The element 33 projects vertically to a greater extent then the elements 34 and 36 so as to reduce the vertical height of the cavity 29 so that the smaller filter element 31 can be used without a gap between the filter and the cabinet 12.

As will be seen in FIG. 5, the pair of adaptors 32 at the lower end of the cabinet 12 substantially fill up the space between the guide rails 24 and 26 and the sides of the filter element 31. Similarly, the pair of adaptor elements 32 at the top of the cabinet 12 perform the same function. In combination, the four adaptor elements 32 precisely locate the filter element 31 in the center of the cabinet 12 and hold it in that fixed position. Further, they prevent the flow of air that otherwise would occur between the filter 31 and the cabinet 12.

While the present invention has been described with reference to a particular preferred embodiment and with the accompanying drawings, it will be understood that those skilled in the art that the invention is not limited to the preferred embodiment and that various modifications and the like could be made to the two without departing from scope of the invention as defined in the following claims.

I claim:

1. A method of adapting the size and configuration of an air filter assembly having top, bottom, front and back sides defining a rectangular cabinet for receiving an air filter therein the framework including a plurality of guide rails attached to said top and bottom sides to define a cavity having fixed vertical and thickness dimensions sized to be substantially equal to those of the relatively large filter element, comprising the steps of:

providing a rail extender bracket for each of said plurality of guide rails;

attaching said extender brackets to said respective guide rails so as to simultaneously reduce said cavity vertical dimension to less than that of a relatively small filter and reduce said cavity thickness to be substantially equal to that of said relatively small filter; and installing said relatively small filter in said reduced cavity.

2. A method as set forth in claim 1 wherein the step of attaching said extender bracket to said respective rails is accomplished by removably attaching said rail extender elements.

3. A method as set forth in claim 2 wherein said rail extender brackets include at least one rib that frictionally engages one side of a guide rail bracket during the attaching step.

4. A method as set forth in claim 1 wherein said plurality of guide rails do not extend the full length of the rectangular cabinet, and said rail extender brackets do extend across the full length of said rectangular cabinet.

5. A method as set forth in claim 1 wherein the number of guide rails and the number of rail extender brackets is four.

6. A method as set forth in claim 1 wherein said rail extender brackets include a U-shaped element, and further wherein said attaching step includes the step of straddling said U-shaped element over a vertically extending portion of said guide rail.

7. A method as set forth in claim 1 wherein said rail extender brackets are S-shaped.

* * * * *

UNITED STATES PATENT AND TRADEMARK OFFICE
CERTIFICATE OF CORRECTION

PATENT NO. : 6,941,630 B2
DATED : September 13, 2005
INVENTOR(S) : Gerald M. Wynn It is certified that error appears in the above-identified patent and that said Letters Patent is hereby corrected as shown below:

Title page,
Item [54], Title, replace "ADAPTER FOR AN AIR CLEANER CABINET" with
-- METHOD FOR ADAPTING THE SIZE AND CONFIGURATION OF AIR FILTER CABINET --.

Column 4,
Line 51, replace "brackets" with -- bracket --.

Signed and Sealed this

Twenty-seventh Day of December, 2005

JON W. DUDAS
*Director of the United States Patent and Trademark Office*